United States Patent [19]

Miko et al.

[11] 4,209,731
[45] Jun. 24, 1980

[54] MAGNETIC SWITCHING REGULATOR FOR A DEFLECTION CIRCUIT

[75] Inventors: Sandor Miko; Phillip R. Mullis, both of Indianapolis, Ind.

[73] Assignee: RCA Corporation, New York, N.Y.

[21] Appl. No.: 964,972

[22] Filed: Nov. 30, 1978

[51] Int. Cl.² .................. H01J 29/70; H01J 29/76
[52] U.S. Cl. .................... 315/400; 358/190; 315/411
[58] Field of Search ............. 315/400, 411; 358/190, 358/243

[56] References Cited
U.S. PATENT DOCUMENTS 3,803,447  4/1974  Wölber .................... 315/400
4,071,810  1/1978  Dobbert ................... 315/400

Primary Examiner—Theodore M. Blum
Attorney, Agent, or Firm—Eugene M. Whitacre; Paul J. Rasmussen; Joseph J. Laks

[57] ABSTRACT

A source of unregulated voltage and a source of rectified deflection rate alternating current voltage is coupled to a deflection circuit. A magnetic switching structure includes two loading windings series coupled with the source of deflection rate voltage. A control circuit developes a bias current in a control winding which permits the load windings to alternately magnetically saturate within each deflection cycle to switch controlled amounts of energy to the deflection circuit.

8 Claims, 14 Drawing Figures

MAGNETIC SWITCHING REGULATOR FOR A DEFLECTION CIRCUIT

BACKGROUND OF THE INVENTION

This invention relates to regulated deflection circuits.

Switching regulators for television receivers typically may include semiconductor switches which controllably rectify an alternating current voltage. The semiconductor switch is relatively costly as it must withstand switch-off transients or large reverse voltages. Such circuits must be protected against failures due to overcurrents or over-voltages. Relatively complicated circuitry may be required to provide the required pulse-width modulated control signals.

Some saturable reactor regulator circuits avoid the use of controllable semiconductor switches, relying instead on impedance variations of the reactor to provide regulation. These reactors however are typically relatively costly, requiring a relatively large cross-sectional area to prevent undue saturation under extreme AC line mains voltage and load current conditions. The DC control current required to provide a given inductance valve is also relatively large, and the percent change in inductance of the saturable reactor may be insufficient to provide good regulation for many deflection circuits encountered.

SUMMARY

A source of unregulated voltage and a source of deflection rate voltage are coupled to a deflection circuit through a magnetic switching structure. The magnetic switching structure magnetically saturates each deflection cycle to couple controlled amounts of deflection rate voltage to the deflection circuit.

DESCRIPTION OF THE INVENTION

Figure 1:
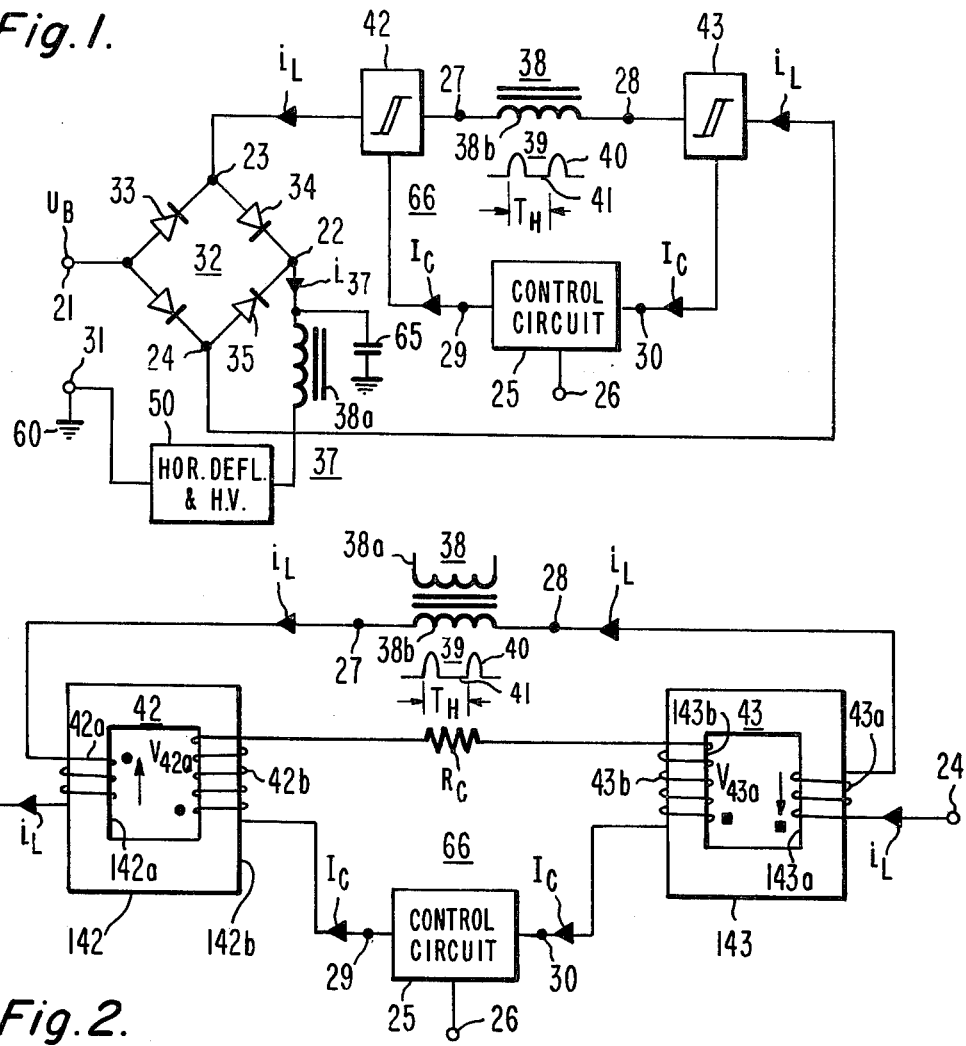
FIG. 1 illustrates a magnetic switching regulator for a deflection circuit embodying the invention.

In FIG. 1, a source of unregulated DC voltage $U_B$ is coupled between terminals 21 and 31, with terminal 31 being designated as a common ground current return terminal 60 not isolated from the AC line mains voltage. Terminal 21 comprises an output terminal of a high frequency full-wave bridge rectifier 32 comprising diodes 33–36. A second output terminal 22 is formed at the junction of the cathodes of diodes 34 and 35. A load 37 circuit is coupled between terminals 22 and 31. Load circuit 37 comprises a conventional horizontal deflection and high voltage circuit 50 coupled to terminal 22 through a primary winding 38a of a flyback transformer 38. A filter capacitor 65 is also coupled to terminal 22.

Flyback transformer 38 functions as a source of high frequency alternating current energy 39. A flyback transformer secondary or regulator winding 38b is coupled between input terminals 23 and 24 of bridge rectifier 32. The high frequency alternating current energy, therefore, comprises a deflection rate, $1/T_H$, voltage 39 comprising a retrace pulse voltage 40 and a trace voltage 41.

Nonlinear magnetic switches 42 and 43 of a magnetic regulator 66 couple the deflection rate source voltage 39 and the unregulated voltage $U_B$ to 37 through high frequency bridge rectifier 32. A control circuit 25 provides a variable DC control signal current $I_c$ to magnetic switches 42 and 43 in response to a feedback signal coupled to a terminal 26. In response to DC control current $I_c$, magnetic switches 42 and 43 magnetically saturate or short-circuit at controlled instants within each deflection cycle and couple deflection rate voltage 39 to load 37 for a controlled amount of time each deflection cycle. A controlled amount of load current $i_{37}$ flows to load 37.

Figure 2:
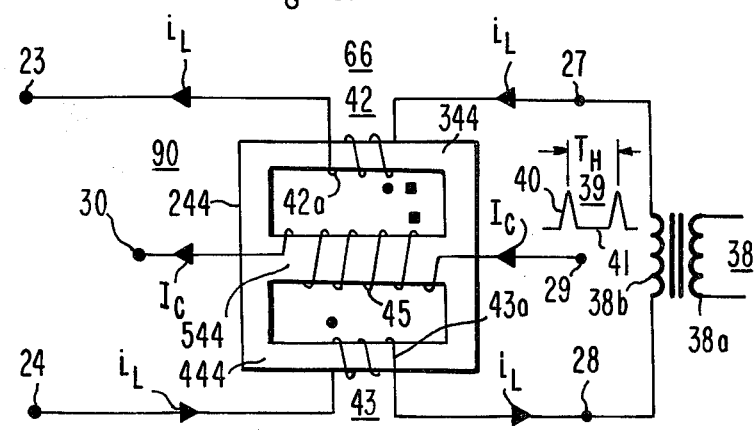
FIG. 2 illustrates an embodiment of winding and magnetic core structure of a magnetic switching regulator of FIG. 1.

FIG. 2 illustrates a portion of the magnetic regulator circuit 66 of FIG. 1 including embodiments of the nonlinear magnetic switches 42 and 43. Magnetic switch 42 comprises a rectangular magnetic core 142 with legs 142a and 142b. Core 142 may be formed of a ferrite material. Wound around leg 142a is a load winding 42a. One terminal of load winding 42a is coupled to input terminal 23 of bridge rectifier 32. Another terminal of load winding 42a is coupled to a terminal 27 of flyback secondary winding 38b.

A control winding 42b is wound around leg 142b of core 142. One terminal of control winding 42b is coupled to control circuit 25 at a terminal 29. Another terminal of control winding 42b is coupled through a resistor Rc to a terminal of a control winding 43b of magnetic switch 43. Another terminal of control winding 43b is coupled to a control circuit 25 at a terminal 30.

Magnetic switch 43 includes a rectangular magnetic core 143 formed illustratively of a ferrite material. Control winding 43b is wound around a leg 143b of core 143. A load winding 43a is wound around a leg 143a. One terminal of load winding 43a is coupled to a terminal 28 of flyback secondary winding 38b. Another terminal of load winding 43a is coupled to input terminal 24 of bridge rectifier 32.

Figure 5:
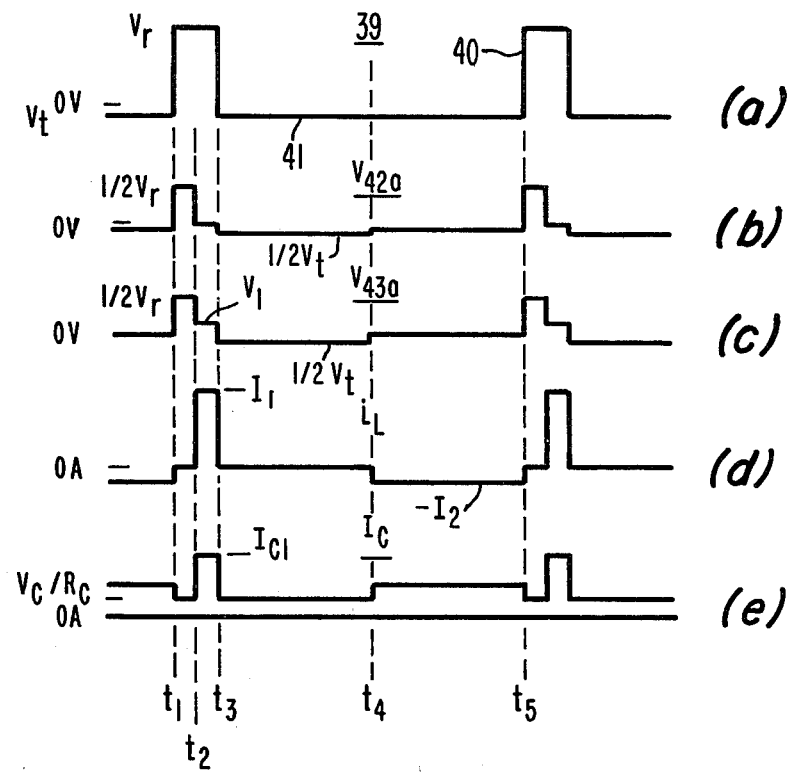
FIGS. 5a–5e and 6a–6e illustrate waveforms associated with the circuits and structure of FIGS. 1–4.

In operation, during retrace the voltage at terminal 27 of flyback secondary winding 38b is illustratively positive with respect to the voltage at terminal 28 when retrace pulse 40 is developed across secondary winding 38b, as illustrated in FIG. 5a by the idealized squarewave pulse 40 of amplitude $V_r$, between times $t_1$–$t_3$ and of amplitude $V_t$ during trace, between times $t_3$–$t_5$. During the first portion of retrace between times $t_1$–$t_2$, core legs 142a and 143b are unsaturated and series coupled load windings 42a and 43a of magnetic switches 42 and 43 present a high impedance to retrace pulse 40.

As illustrated in FIG. 5b by the voltage $V_4$ across load winding 42a and as illustrated in FIG. 5c by the voltage $V_{43a}$ across load winding 43a, substantially all of the retrace pulse voltage amplitude is developed substantially equally across the load windings. Very little retrace voltage is coupled to load 37, considered ideally as a resistance $R_L$.

As illustrated in FIG. 5d, the load current $i_L$ flowing in windings 42a and 42b between times $t_1$–$t_2$ is substantially zero, neglecting the small magnetizing currents flowing in the windings that develop magnetic flux in cores 142 and 143. During a first portion of retrace between times $t_1$–$t_2$, the fluxes in cores 142 and 143 increase as a function of the time integration of the retrace voltages developed in load windings 42a and 43a.

With the winding polarity of load winding 42a relative to control winding 42b as indicated by the dotted symbols in FIG. 2, and with the winding polarity of load winding 43a relative to control winding 43b as indicated by the rectangular symbols, the voltages in control windings 42b and 43b induced by respective load windings 42a and 42b are balanced, of approximately equal magnitude but of opposite polarity. The voltage across control resistor $R_c$ is a DC control voltage $V_c$ developed by control circuit 25, and the control current $I_c$ approximately equals $V_c/R_c$, between times $t_1$–$t_2$, as illustrated in FIG. 5e. Because load windings 42a and 43a are series coupled, control current $I_c$ generates no reflected currents in load windings 42a and 43a.

Control current $I_c$ does, however, produce a DC bias flux in core 142 which adds in the same direction to the increasing core flux generated by the retrace pulse developed in load winding 42a. Without the additional bias flux developed by control current $I_c$, the flux increase in core leg 142a would be insufficient to reach saturation flux density values. With the additional DC bias flux present, core legs 142a and 142b saturate at a controlled instant $t_2$ within retrace, the exact instant being a function of the amount of control current flowing.

With core legs 142a and 142b saturated at time $T_2$, the induced voltage in load winding 42a decreases to zero, as illustrated in FIG. 5b by the voltage $V_{42a}$. Similarly the voltage in control winding 42b also decreases to zero.

Core legs 143a and 143b however do not saturate during the positive retrace pulse interval $t_1$–$t_3$. With the winding polarities of load winding 43a relative to control winding 43b as indicated in FIG. 2, the DC bias flux flowing in core 143 that is produced by control current $I_c$ opposes the flux that is produced by the retrace pulse developed in load winding 43a, thereby preventing core 143 from saturating.

Thus, between times $t_2$–$t_3$ core 142 is saturated while core 143 is unsaturated. The induced voltages in control windings 42b and 43b are unbalanced, with zero voltage being induced across control winding 42b and a reflected retrace pulse voltage being induced across control winding 43b. Control current $I_c$ increases in amplitude between times $t_2$–$t_3$ to a value $I_{cI}$, which current is then reflected back into load winding 43a as an increase in load current, the current $i_L$ increasing to an amplitude $I_1$. Because the turns ratio of control winding to load winding is typically relatively large, about 60 to 1 for the values listed below, the increase in current $i_L$ between times $t_2$–$t_3$ is also relatively large, as illustrated in FIG. 5d.

Alternatively explained, the large increase in load current $i_L$ after time $t_2$ when magnetic switch 42 saturates is due to the short-circuiting of both load windings 42a and 43a. With core 142 saturated, no induced voltage opposing the flow of current can be developed in load winding 42a. Also with core 142 saturated the voltages in control windings 42b and 43b are unbalanced. Unsaturated magnetic switch 43 functions as a current transformer, and the relatively low impedance of control resistor $R_c$ is reflected across loading winding 43a thereby also effectively short circuiting load winding 43a. With windings 42a and 43a short-circuited, a relatively large increase in load current $i_L$ flows between times $t_2$–$t_3$, with retrace pulse voltage 40 being coupled to load circuit 37. As illustrated in FIG. 5c the voltage across load winding 43a equals a voltage $V_1$ approximately equal to the retrace pulse voltage less the IR drop across load circuit 37.

During the negative portion of deflection rate voltage 39, that is, during the trace interval $t_3$–$t_5$, magnetic saturation of switch 43 occurs near time $t_4$. Switch 43 saturates and switch 42 remains unsaturated because the DC control current $I_c$ during the trace interval adds a bias flux in core 143 in the same direction as the flux induced by the negative trace voltage, but subtracts from the flux induced in core 142. A load current $i_L$ of somewhat increased magnitude $I_2$ but of opposite polarity flows in load windings 42a and 43a between times $t_4$–$t_5$, as both the windings are short-circuited. Load winding 43a is short-circuited because core 143 is saturated, and load winding 42a is also effectively short-circuited because the low impedance of resistor $R_c$ is reflected across load winding 42a.

It should be noted that the voltage levels illustrated for $V_{42a}$ and $V_{43a}$ in FIGS. 5b and 5c are idealized and approximate.

The time integration over the positive portion of each voltage, however, will be equal to the time integration over the negative portion.

Regulation is achieved by varying the amounts of deflection rate voltage coupled to load 37 by varying the instants $t_2$ and $t_4$ within each deflection cycle when magnetic switches 42 and 43 alternatively magnetically saturate. Increased bias flux produced by an increased control current $I_c$ permits core leg 142a to saturate earlier within retrace. Load current $i_L$ will flow longer and thus couple an increased amount of deflection rate voltage to load circuit 37, as is required under increased loading or low AC line mains voltage conditions. Similarly, for decreased loading or high AC line mains voltage conditions, a decreased control current permits later core saturation as also required.

The control current $I_c$ flowing in control windings 142b and 143b comprises two components. As illustrated in FIG. 5e, control current $I_c$ includes a DC current applied by a DC voltage source in control circuit 25 and also includes a component comprising the load current $i_L$ reflected from control windings 42b and 43b to load windings 42a and 43a. The winding polarities of load winding 42a with respect to control winding 42b and load winding 43a with respect to winding 43b are such as to provide cancellation of the sum of the induced voltages developed in the series coupled control windings when both cores 142 and 143 are unsaturated.

Figure 3:
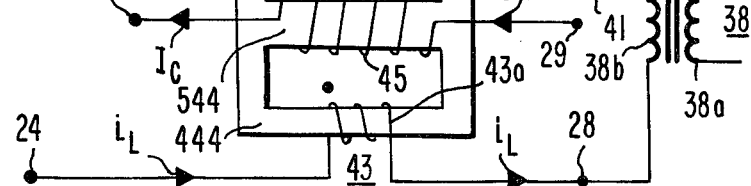
FIG. 3 illustrates another embodiment of winding and magnetic core structure of a magnetic switching regulator of FIG. 1.

Although the net induced voltage across the series arrangement of control windings 42b and 43b is zero when both cores 142 and 143 are unsaturated, a large retrace pulse voltage nevertheless is developed in each of the control windings for part of the retrace interval, requiring substantial winding insulation to prevent corona breakdown. The magnetic regulator 66 illustrated in FIG. 3 provides for a magnetic structure 90 wherein magnetic switches 42 and 43 are arranged on a single two window core 244. A single control winding 45 is used, with no induced voltage being developed therein. Load winding 42a is wound around an outer leg 344, load winding 43a is wound around an outer leg 444, and control winding 45 is wound around center leg 544.

The winding polarity of load winding 42a with respect to control winding 45 is indicated by the associated rectangular winding polarity symbols of FIG. 3.

Positive magnetizing current flowing from terminal 27 to load winding 42a during retrace generates a flux in leg 344 that is in the same direction as the bias flux generated by control current $I_c$ flowing from terminal 29 to control winding 45, as is required to produce core saturation in leg 344. With the winding polarity of load winding 42a relative to load winding 42b as indicated by the dotted polarity symbols of FIG. 3, the fluxes generated by the retrace pulses developed in load windings 42a and 43a flow in opposite cancelling directions in center leg 544. Thus, while core legs 344 and 444 are unsaturated, the retrace pulses in load windings 42a and 43a induce no substantial voltage in control winding 45, thereby reducing corona breakdown and insulation requirements.

Figure 4:
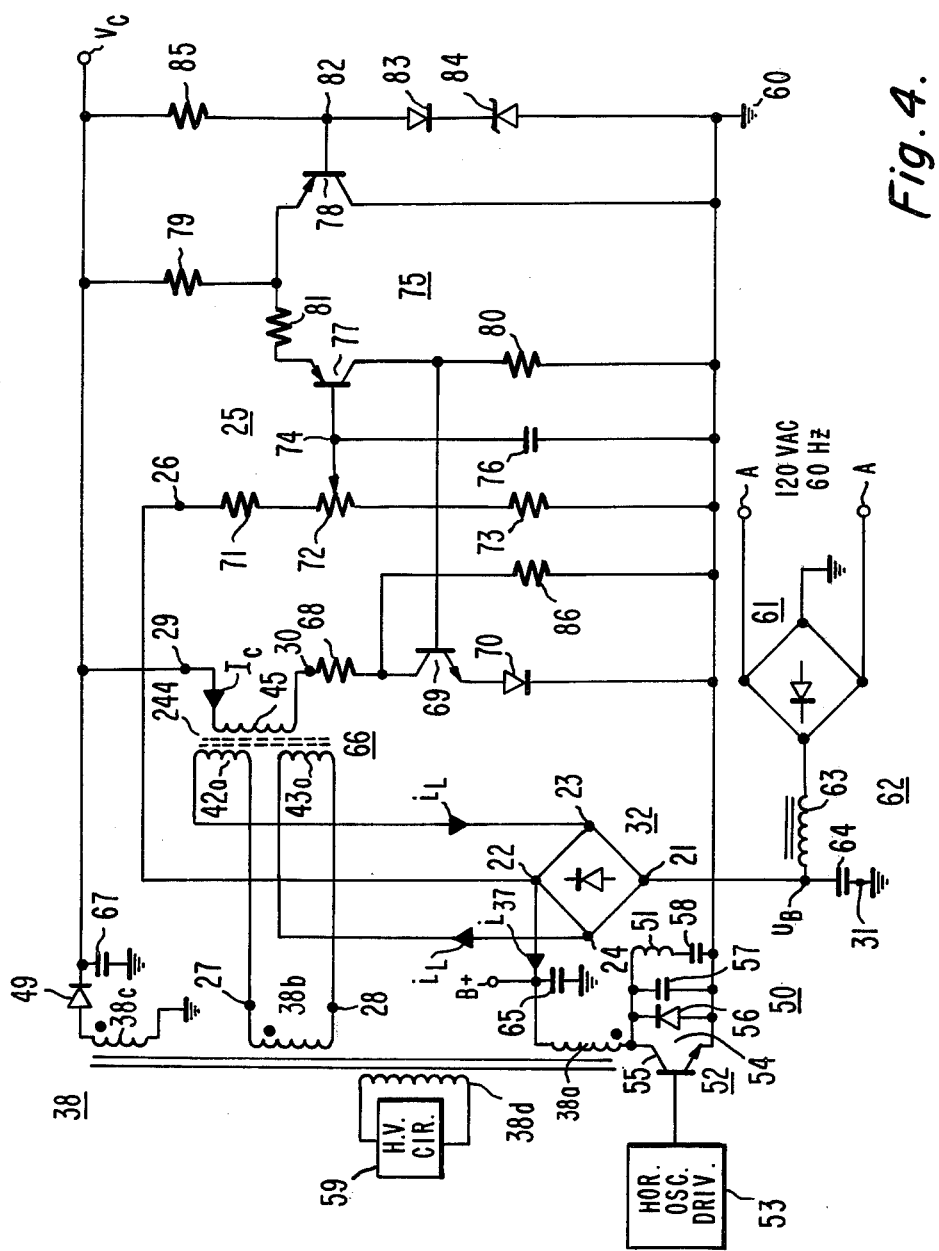
FIG. 4 illustrates a horizontal deflection circuit and a magnetic switching regulator embodying the invention.

Illustrated in FIG. 4 is a magnetically regulated horizontal deflection circuit 50 embodying the invention. Illustrated in FIGS. 6a–6e are waveforms at indicated locations in the circuit of FIG. 4 which correspond to respective waveforms of FIGS. 5a–5e. Horizontal deflection circuit 50 comprises a horizontal deflection winding 51, a horizontal deflection generator 52 for developing deflection or scanning current in deflection winding 51, and a horizontal output or flyback transformer 38. Horizontal deflection generator 52 comprises a conventional horizontal oscillator and driver 53, a horizontal trace switch 54 comprising a horizontal output transistor 55, to which control base electrode deflection rate switching signals are coupled to turn off transistor 55 and to initiate retrace, a damper diode 56, a retrace capacitor 57 and a trace capacitor 58 series coupled with deflection winding 51. The emitter of transistor 55 is coupled to the nonisolated ground 60.

Flyback transformer 38 comprises a primary winding 38a, coupled to trace switch 54, a flyback transformer regulator secondary winding 38b, a low voltage winding 38c, and a high voltage winding 38d coupled to a high voltage circuit 59 for generating a beam current ultor accelerating potential.

AC line main voltage of illustratively 120VAC, 60Hz is coupled to terminals A—A, full-wave rectified by bridge rectifier 61 and filtered by an L-section filter 62 comprising a choke inductor 63 and a capacitor 64. An unregulated DC supply voltage $U_B$, illustratively of +90 volts DC is developed across capacitor 64 or across terminals 21 and 31.

Terminal 21 comprises an output terminal of high frequency bridge rectifier 32. Horizontal deflection circuit 50 comprises the load circuit 37 of FIG. 1, with flyback primary winding 38a coupled to output terminal 22 of high frequency bridge rectifier 32.

Figure 6:
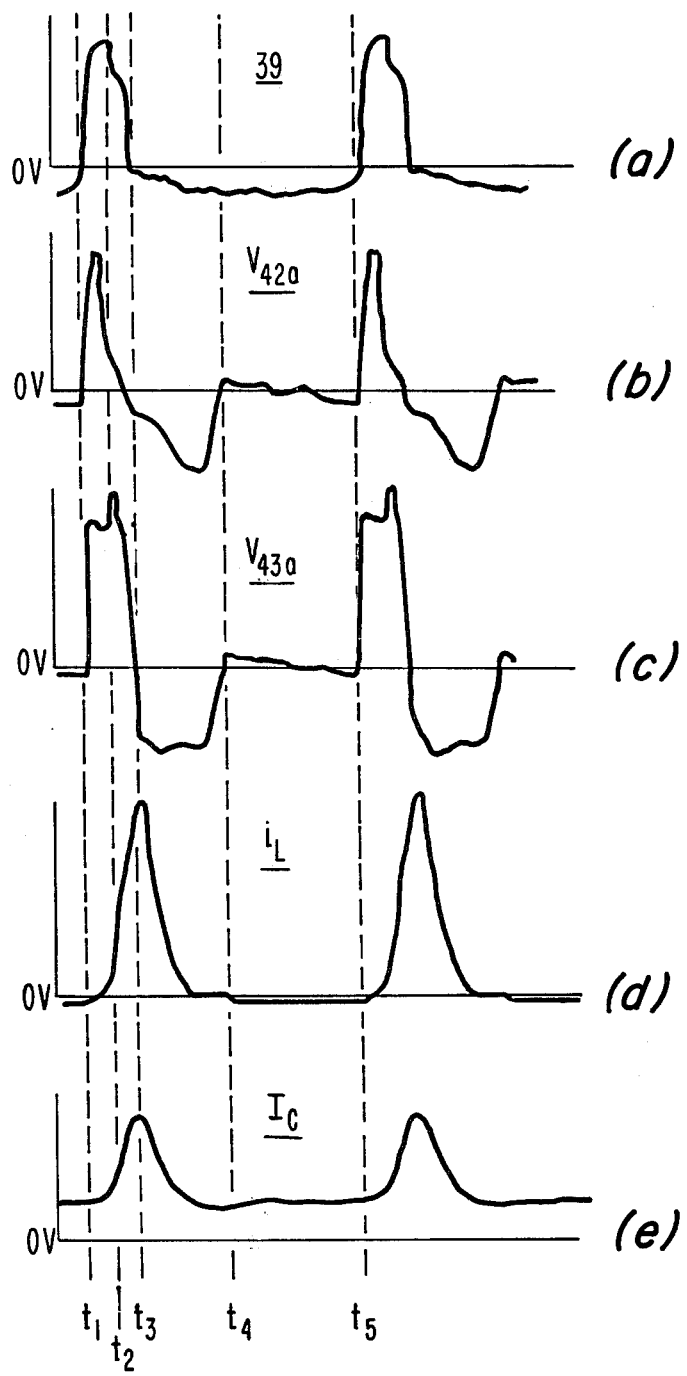

Coupled across input terminals 23 and 24 is a source of high frequency deflection rate alternating current energy 39 developed by flyback regulator secondary winding 38b, as illustrated in FIG. 6a by the voltage across secondary winding 38b. Controlled amounts of the deflection rate voltage are coupled by magnetic regulator 66 to high frequency bridge rectifier 32. Rectifier 32 rectifies and adds the deflection rate voltage to the unregulated DC voltage $U_B$ of terminal 21 to provide a regulated B+ scanning voltage at terminal 22, illustratively of a larger magnitude of +114 volts DC. A capacitor 65 filters the regulated B+ voltage.

Magnetic regulator 66 includes the core and winding structure of FIG. 3, which is only schematically indicated in FIG. 4. The voltage $V_{42a}$ across load winding 42a and the voltage $V_{43a}$ across load winding 43 are illustrated respectively in FIGS. 6b and 6c. As explained previously, operation of magnetic regulator 66 is such that each of the load windings alternately substantially saturates magnetically. Load winding 42a is generally saturated magnetically between times $t_2$–$t_3$ and load winding 43a is generally saturated between times $t_4$–$t_5$. As illustrated in FIG. 6d, the load current $i_L$ substantially increases in magnitude in retrace between times $t_2$–$t_3$ with a lesser magnitude increase in trace between times $t_4$–$t_5$.

A control voltage $V_c$ coupled to control winding 45 is obtained from flyback low voltage winding 38c through retrace pulse rectification by a diode 49 and filtering by a capacitor 67.

Control winding 45 is series coupled with a resistor 68, a control transistor 69 and a diode 70 of control circuit 25. To vary control current $I_c$, illustrated in FIG. 6e, for providing regulation, the impedance of control transistor 69 is varied, rather than the magnitude of voltage $V_c$.

The B+ voltage at terminal 22 functions as a feedback voltage coupled to terminal 26 of control circuit 25. A voltage divider comprising resistor resistors 71–73 is coupled to feedback terminal 26. An input terminal 74 of a differential comparator 75 is coupled to the wiper arm of resistor 72. A horizontal rate bypass capacitor 76 is coupled to input terminal 74. Differential comparator 75 comprises differentially coupled transistors 77 and 78, common emitter resistor 79, collector resistor 80, and a loop gain decreasing resistor 81 coupled between the emitter of transistor 77 and the junction resistor 79 and the emitter of transistor 78.

The base of transistor 77 is coupled to input terminal 74. The base of transistor 78 is coupled to a reference input terminal 82 at which terminal a reference voltage is established by a series coupled diode 83 and zener diode 84. Bias current for zener diode 84 is provided by a resistor 85 coupled to the $+V_c$ voltage.

Base current to control transistor 69 is provided from the collector of transistor 77 and is varied in accordand with variations in the B+ supply voltage level. A decrease in B+ voltage, for example, increases the base current to control transistor 69 thereby increasing the control current $I_c$. Load windings 42a and 43a magnetically saturate at earlier instants within their respective portions of the deflection cycle, thereby increasing the load current $i_L$ and the current $i_{37}$ flowing to charge capacitor 65 to maintain a regulated B+ voltage level. A resistor 86 parallels control transistor 69 and maintains a minimum control current $I_c$, even when control transistor 69 is cut off, in order to prevent corona arcing in control winding 45.

Selected component and circuit values for the circuit of FIG. 4 are given below:

| | | |
|---|---|---|
| Resistor | 68: | 100 ohm |
| | 71: | 68 Kilohm |
| | 72: | 18 Kilohm |
| | 73: | 11 Kilohm |
| | 79: | 8.2 Kilohm |
| | 80: | 5.6 Kilohm |
| | 81: | 1.0 Kilohm |
| | 85: | 3.9 Kilohm |
| | 86: | 15 Kilohm |
| Capacitor | 64: | 250 Microfarad |
| | 65: | 1.5 Microfarad |
| | 76: | 0.01 Microfarad |
| Inductor | 63: | 160 Millihenry |
| Zener Diode | 84: | 22 Volt |
| Load Current | $i_{37}$: | 0.6 Ampere Average; |
| at 60 watt | | 4 Ampere Peak |

```
        input loading
        Control Current I_c:    40 Milliampere Average;
                                80 Milliampere Peak.

Deflection rate voltage across flyback regulator
winding 38b: 125 volts, peak to peak.
V_c: +27 volts DC
U_B: 95-120 volts DC
B+: 120 volts DC
Magnetic Structure 90:
     Core 244: 2 E-shaped sections each section
               equivalent to Ferroxcube 206F4403E2A,
               Ferroxcube Corporation Saugerties,
               New York.
     Center leg cross-section: 0.313 in. × 0.44 in.
     Each Outer leg cross-section: 0.181 in. ×
     0.44 in.
     Length of Each Leg: 0.83 in.
     Height of Core: 1.17 in.
     Load Windings 42a and 43a: each 25 turns,
     #25 gauge insulated magnet
     copper wire.
     Control Winding 45: 1600 turns, #36 gauge in-
     sulated magnet copper wire.
```

A relatively small control current $I_c$ flows in control winding 45, typically about 40 milliamperes average. Thus, relatively little resistive losses occur in magnetic regulator 66. No controlled semiconductor switches, that may be prone to failure, are used, and the control circuitry is relatively simple. Because magnetic switches 42 and 43 are operated in essentially only two states, saturated and unsaturated, magnetic structure 90 of FIG. 3 may be of compact design, requiring only a small control circuit to varying the switching states. The regulation range, as in semiconductor switches, is also relatively large.

What is claimed is:

1. A magnetically regulated deflection circuit, comprising:
   a deflection winding;
   a deflection generator coupled to said deflection winding for producing deflection current in said deflection winding, said deflection generator including a source of deflection rate energy;
   a source of unregulated energy;
   magnetic switching means including a first load winding wound around a core portion, said first load winding applying said source of unregulated energy and said source of deflection rate energy to said deflection circuit when said first load winding is short-circuited by magnetically saturating said core portion for transferring energy to said deflection circuit; and
   a control circuit coupled to said magnetic switching means and responsive to an energy level of said deflection circuit for varying the short-circuiting interval within which said source of unregulated energy and said source of deflection rate energy are applied to said deflection circuit for regulating the amount of energy transferred to said deflection circuit.

2. A circuit according to claim 1 wherein said control means includes a control winding magnetically coupled to said first load winding for magnetically saturating said core portion at a varied instant within each deflection cycle in response to changes in said energy level.

3. A circuit according to claim 2 wherein said control circuit develops a bias current in said control winding for magnetically saturating said first load winding during at least a portion of each retrace interval of each deflection cycle.

4. A circuit according to claim 3 including a second load winding series coupled with said source of deflection rate energy and magnetically coupled to said control winding, said bias current alternately saturating said first and second load windings each deflection cycle.

5. A circuit according to claim 4 wherein said control circuit provides a substantially short-circuit reflected impedance to the other of said first and second load windings when one of said first and second windings is magnetically saturated.

6. A circuit according to claim 5 wherein said magnetic switching means includes a two window core, said first and second load windings located about outer legs of said core, said control winding located about a center leg of said core, the windings polarities of the 3 windings such that the bias current generates a bias flux that adds to the flux in said first winding and subtracts from the flux in said second winding during a first portion of each deflection cycle and has an opposite effect during a second portion of each deflection cycle.

7. A circuit according to claim 6 wherein said magnetic switching means includes first and second cores, said first load winding and a first portion of said control winding located about said first core, said second load winding and a second portion of said control winding located about said second core, said bias current alternately saturating said first and second cores each deflection cycle.

8. A magnetic regulator and deflection circuit, comprising:
   a horizontal deflection winding;
   a horizontal deflection circuit coupled to said horizontal deflection winding for generating scanning current in said horizontal deflection winding each deflection cycle;
   a horizontal output transformer including a transformer winding in which there is developed a horizontal rate voltage;
   a source of unregulated voltage;
   first and second magnetic regulator windings coupled with said source of unregulated voltage, said transformer winding, and said horizontal deflection circuit;
   a magnetic control winding for generating a magnetic flux linking said first and second magnetic regulator windings in such a manner that during a first polarity interval of said deflection cycle, the magnetic flux generated by said control winding adds to the magnetic flux generated by said first magnetic regulator winding and subtracts from the magnetic flux generated by said second magnetic regulator winding for causing said first and second magnetic regulator windings to short-circuit in order to apply said horizontal rate voltage and said unregulated voltage to said horizontal deflection circuit; and
   control means for developing a control current in said magnetic control winding in accordance with an energy level of said horizontal deflection circuit for varying the short-circuiting instant of said first and second magnetic regulator windings for regulating said energy level.

* * * * *

UNITED STATES PATENT AND TRADEMARK OFFICE
CERTIFICATE OF CORRECTION

PATENT NO. : 4,209,731

DATED : June 24, 1980

INVENTOR(S) : SANDOR MIKO ET AL.

It is certified that error appears in the above-identified patent and that said Letters Patent is hereby corrected as shown below:

Column 1, line 24, "valve" should read -- value --.

Column 3, line 29, "$T_2$" should read -- $t_2$ --. Column 7, line 33, "circuit" should read -- current --.

Signed and Sealed this

Twenty-sixth Day of August 1980

[SEAL]

Attest:

SIDNEY A. DIAMOND

Attesting Officer  Commissioner of Patents and Trademarks